US011552446B2

(12) United States Patent
Kuhn et al.

(10) Patent No.: US 11,552,446 B2
(45) Date of Patent: Jan. 10, 2023

(54) COOLING DEVICE FOR COOLING AN ELECTRICAL COMPONENT AND METHOD FOR PRODUCING A COOLING DEVICE

(71) Applicant: Rogers Germany GmbH, Eschenbach (DE)

(72) Inventors: Nico Kuhn, Eschenbach (DE); Manfred Götz, Weiden (DE); Andreas Meyer, Speichersdorf (DE); Vitalij Gil, Hersbruck (DE); Johannes Wiesend, Speinshart (DE)

(73) Assignee: ROGERS GERMANY GMBH, Eschenbach (DE)

( * ) Notice: Subject to any disclaimer, the term of this patent is extended or adjusted under 35 U.S.C. 154(b) by 163 days.

(21) Appl. No.: 16/651,464

(22) PCT Filed: Sep. 5, 2018

(86) PCT No.: PCT/EP2018/073836
§ 371 (c)(1),
(2) Date: Mar. 27, 2020

(87) PCT Pub. No.: WO2019/063251
PCT Pub. Date: Apr. 4, 2019

(65) Prior Publication Data
US 2020/0266606 A1  Aug. 20, 2020

(30) Foreign Application Priority Data

Sep. 28, 2017 (DE) .......................... 102017122575.7

(51) Int. Cl.
*H01S 5/024* (2006.01)
*H01S 5/0237* (2021.01)

(52) U.S. Cl.
CPC ........ *H01S 5/02423* (2013.01); *H01S 5/0237* (2021.01); *H01S 5/02484* (2013.01)

(58) Field of Classification Search
CPC ............. H01S 5/02423; H01S 5/02476–02492
See application file for complete search history.

(56) References Cited

U.S. PATENT DOCUMENTS

| 2006/0045153 A1* | 3/2006 | Carter ................. H01S 5/02423 372/36 |
| 2006/0203866 A1 | 9/2006 | Stephens, IV |

(Continued)

FOREIGN PATENT DOCUMENTS

| CN | 202652683 U | 1/2013 |
| DE | 19605302 A1 | 8/1997 |

(Continued)

OTHER PUBLICATIONS

Active Metal Brazing, p. 1 (Year: 2021).*

*Primary Examiner* — Tod T Van Roy
*Assistant Examiner* — Delma R Fordé
(74) *Attorney, Agent, or Firm* — Cantor Colburn LLP

(57) ABSTRACT

A cooling device (1) for cooling an electrical component (4), in particular a laser diode, including
a base body (2) with at least one outer face (20) and at least one integrated cooling channel (5), in particular a micro-cooling channel,
a connecting surface (21) on the outer face (20) of the base body (2) for connecting the electrical component (4) to the base body (2) and
a first stabilising layer (11),
wherein the first stabilising layer (11) and the connecting surface (21) are arranged at least partially one above the other along a primary direction (P), and
wherein the first stabilising layer (11) is offset relative to the outer face (20) towards the interior of the base body (2) by a distance (A) along a direction parallel to the primary direction (P).

18 Claims, 3 Drawing Sheets

(56) References Cited

U.S. PATENT DOCUMENTS

| | | | |
|---|---|---|---|
| 2008/0056314 A1* | 3/2008 | Coleman | H01S 5/4031 372/36 |
| 2009/0092162 A1* | 4/2009 | Huff | H01S 5/4025 372/36 |
| 2019/0036300 A1* | 1/2019 | Ueda | H01S 5/0233 |

FOREIGN PATENT DOCUMENTS

| | | | |
|---|---|---|---|
| DE | 19956565 A1 * | 5/2001 | H01L 21/4882 |
| DE | 20302430 U1 | 5/2003 | |
| DE | 112011103477 T5 | 7/2013 | |
| WO | 9730494 A1 | 8/1997 | |
| WO | WO-2008128948 A2 * | 10/2008 | H01L 23/473 |

* cited by examiner

COOLING DEVICE FOR COOLING AN ELECTRICAL COMPONENT AND METHOD FOR PRODUCING A COOLING DEVICE

CROSS-REFERENCE TO RELATED APPLICATIONS

This application is a National Stage application of PCT/EP2018/073836, filed Sep. 5, 2018, which claims the benefit of German Application No. 10 2017 122 575.7, filed Sep. 28, 2017, both of which are incorporated by reference in their entirety herein.

BACKGROUND

The present invention concerns a cooling device for cooling an electric or electronic component, in particular a laser diode, and a method of manufacturing a cooling device.

Such cooling devices are known, for example, from JP 2016 115 767 A and are primarily intended to counteract heat development of the electrical component during operation. An essential component of such cooling devices is a base body in which one or more cooling channels are integrated and on the outside of which the electrical component, e.g. a laser diode, can be attached to a connecting or mounting surface. Since the laser diode and the base body are typically made of different materials, they exhibit different coefficients of thermal expansion in a corresponding manner. As a result, mechanical stress can occur in the boundary area between the laser diode and the base body, which can lead to a deformation of the laser diode, or the base body can deform, so that the laser diode is also deformed. As a result of this deformation, a so-called "smile" effect occurs, in which the individual emitters of a laser diode bar arranged next to each other emit light at different heights. The result of this "smile" effect is an increased effort in focusing the light emitted by the individual emitters.

In order to ensure the desired straightness of the individual emitters in a laser diode bar, the state of the art knows stabilising layers or intermediate layers between the component and the base body, so-called submounts, which are attached to the outside of the base body to adjust the expansion coefficients and support the laser diode as sockets. As can be seen from JP 2016 115 767 A, it is also common practice that in addition to the stabilising layer on the connecting surface, a further stabilising layer is provided on the base body, which is located on the side of the base body opposite the connecting surface. This solution, however, means that laser diode manufacturers first have to implement the stabilising layers in a complex way, and then in a further step they have to attach the laser diode to the heat sink.

SUMMARY

It is thus an object of the present invention to provide a cooling device on which the laser diode can be mounted in a simple manner, while also counteracting the "smile" effect.

According to the invention, a cooling device is provided for cooling an electrical component, in particular a laser diode, comprising
 a base body having an outer face and at least one integrated cooling channel, in particular a micro-cooling channel,
 a connecting surface on the outer face of the base body for connecting the electrical component to the base body and
 a first stabilising layer,
 wherein the first stabilising layer and the connecting surface are arranged at least partially one above the other along a primary direction, and
 wherein the first stabilising layer is offset or displaced relative to the outer face by a distance along a direction parallel to the primary direction towards the interior of the base body.

Further advantages and features result from the following description of preferred embodiments of the subject matter of the invention with reference to the attached figures. Individual features of the individual embodiments can be combined within the scope of the invention.

DETAILED DESCRIPTION OF THE INVENTION

Figure 1:
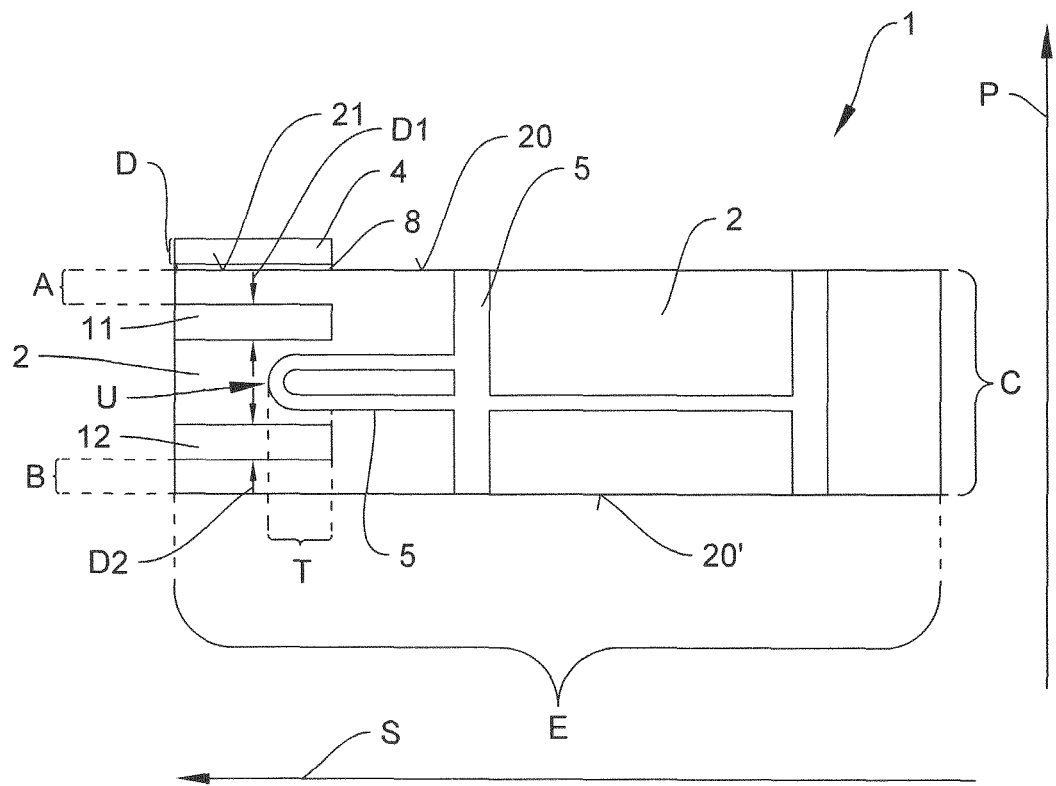
FIG. 1: illustrates a cooling device according to a first preferred embodiment of the present invention

Compared to the state of the art, it has been shown in a surprising way that an adjustment of the coefficients of thermal expansion can still be made to a sufficient extent even if the first stabilising layer is offset inwards relative to the connecting surface and is not part of the outer face of the base body. The result is that a cooling device can be provided, in which a first stabilising layer is already integrated, so that on the side of the component manufacturers a direct connection of the electrical component, in particular the laser diode, can take place. A further advantage is that the integration of the first stabilising layer protects it against environmental influences, e.g. against corrosion damage. In particular, it is intended that the component will comprise a laser diode bar with several individual emitters.

It is preferably provided that the primary direction is essentially perpendicular to the connecting surface or an outer face of the base body. For example, the connecting surface is a part of an outer face extending along the longitudinal extension of the base body. In particular, the connecting surface forms less than a quarter of this outer face. Furthermore, the base body has an inlet and outlet through which a cooling fluid can be introduced into the cooling channel. An integrated cooling channel is preferably understood to be one which runs essentially, i.e., in particular with the exception of the inlet and outlet, inside the base body. In particular, the base body is made of a metal, preferably copper, while the first stabilising layer is made of another material, in particular a non-metal. Furthermore, the first stabilising layer extends essentially parallel to the connecting surface. However, it is also conceivable that the first stabilising layer runs at an angle to the outer face.

According to a further embodiment of the present invention, it is provided that a second stabilising layer is provided, wherein the first stabilising layer, the second stabilising layer and the connecting surface are arranged at least partially one above the other along a primary direction and the first stabilising layer is arranged closer to the connecting surface than the second stabilising layer. By means of a second stabilising layer, it is possible to advantageously counteract a bending of the base body under thermal stress and thus the formation of a "smile" effect when individual emitters of a laser bar are arranged on the cooling device. It is preferably intended that the second stabilising layer should be parallel to the connecting surface and/or the first stabilising layer. However, it is also conceivable that the first stabilising layer and/or second stabilising layer run at an angle to the outer face. Preferably, the second stabilising layer is also integrated into the base body. In particular, the second stabilising layer is offset by a further distance into the interior of the base body in relation to a further outer face opposite the connection surface on the base body.

In particular, it is provided that the first stabilising layer and the second stabilising layer will be equivalent in terms of their material composition and geometric shape. Preferably, the distance, i.e., a distance between the first stabilizing layer and the outer face, then corresponds to the further distance, i.e., a distance between the second stabilizing layer and the further outer face.

It is advisable for the distance between the bonding surface and the first stabilising layer to have a value between 100 μm and 1000 μm, preferably between 150 μm and 750 μm and particularly preferably between 200 μm and 500 μm. In particular, for distances between 300 μm and 500 μm, it has been shown that a sufficiently stable part of the base body can be produced in production and, in addition, the greatest possible influence can be exerted on the coefficient of expansion in the connecting area between the component and the base body.

In a further embodiment of the present invention, it is intended that the first stabilising layer comprises of diamond and/or silicon carbide. Also conceivable are other materials with high thermal conductivity such as AlN, BeO, W, Mo or Si and/or composites with a metallic matrix based on Cu or Ag. Due to the very high thermal conductivity, a first stabilizing layer of diamond and/or silicon carbide proves to be particularly advantageous for the heat spread during heat transport from the electrical component developing heat to the cooling channel or into the base body. Furthermore, it is conceivable that the first stabilising layer and/or the second stabilising layer is continuous or interrupted when viewed in the primary and/or secondary direction. Furthermore, it is conceivable that several first stabilising layers and/or several second stabilising layers are arranged on top of each other in the primary direction.

It is preferably provided that the first stabilising layer and the connecting surface are congruent with each other in the primary direction. The term "congruent" means, in particular, that the first stabilising layer does not protrude beyond or be flush with the connecting surface or the laser diode when viewed in a secondary direction perpendicular to the primary direction. Preferably, the extensions or areas of the connecting surface on the one hand and the secondary layer on the other hand, measured perpendicular to the primary direction, correspond to each other. It is also conceivable that the second stabilising layer is arranged congruently with the connecting surface and/or the first stabilising surface. In particular, it is intended that the first stabilising layer and/or the second stabilising layer should not extend over the entire length or longitudinal extension of the cooling device along the secondary direction. This reduces the amount of material and the associated additional costs for the first stabilising layer and the second stabilising layer. In particular, the secondary direction is parallel to the longitudinal direction or extension of the base body.

Preferably, it is intended that between the first stabilising layer and the second stabilising layer at least a subsection of the cooling channel extends in the primary direction. This has the advantage that the cooling fluid can be brought as close as possible to the laser diode to be cooled. For example, a deflection area of the cooling channel is arranged below the connecting surface, viewed in the primary direction. Preferably, a ratio of a length, measured along the secondary direction, of that part of the cooling channel, which, viewed in the primary direction, is located between the first stabilising layer and the second stabilising layer, to the length of the first stabilising layer, measured along the secondary direction, has a value between 0.2 and 0.8, preferably between 0.5 and 0.75 and more preferably between 0.6 and 0.7. Especially with a ratio between 0.6 and 0.7, it has been shown that a most uniform cooling of the component through the cooling channel can be achieved.

In particular, it is provided that the first stabilising layer extends along a secondary direction perpendicular to the primary direction over a first length, wherein the second stabilising layer extends along the secondary direction over a second length and the connecting surface extends along the secondary direction over a third length, wherein the ratio of the first length and/or the second length to the third length has a value between 0.5 and 6.0, preferentially has a value between 0.5 and 3.0, preferably a value between 0.9 and 2.0 and particularly preferably between 0.95 and 1.5. As a result, the first stabilising layer or the second stabilising layer extends further than the connecting surface when viewed in the secondary direction. Especially with diamond or silicon carbide as materials for the first stabilising layer and the second stabilising layer, this length, which is longer than the third length, allows further heat expansion in the base body. It is preferably provided that the first length and/or the second length has a value between 5 and 25 mm, preferably between 6 and 18 mm and especially preferably between 7 and 15 mm. Preferably, a ratio between the third length of the connecting surface measured along the secondary direction S and the first length of the first stabilising layer has a value between 0.33 and 0.99, preferably between 0.5 and 0.98 and particularly preferably between 0.66 and 0.95.

It is advisable to provide that the first stabilising layer differs from the second stabilising layer, in particular with regard to its position within the base body, its material composition and/or its extension, in particular thickness, in a direction parallel to the primary direction. This makes it possible, for example, to integrate diamond and/or silicon carbide into the first stabilising layer, while the second stabilizing layer comprises molybdenum, tungsten, silicon, a laminate, CuW, CuMo or a ceramic or glass. This allows additional costs for the second stabilising layer to be controlled or kept low. In order to nevertheless achieve a symmetrisation of the thermal expansion coefficient in the primary direction and thus counteract a bending of the base body, it is advantageous to modify the second stabilising layer accordingly, i.e., with regard to the dimensioning and position of the second stabilising layer.

Preferably, the first length and/or the third length is greater than a distance between the first stabilising layer and the connecting surface measured in the primary direction.

A further aspect of the present invention is a method of manufacturing a cooling device according to one of the preceding claims, wherein the first and/or the second stabilising layer are attached to the base body by means of an active soldering process. All features described for the cooling device according to the invention and their advantages can also be transferred analogously to the method according to the invention and vice versa.

An active solder process, e.g. for connecting metal layers or metal foils, in particular also copper layers or copper foils with ceramic material, is a process which is also used in particular for the production of metal-ceramic substrates, a connection is produced between a metal foil, for example copper foil, and a ceramic substrate, for example aluminium nitride ceramic, at a temperature between approx. 650-1000° C. using a brazing solder which also contains an active metal in addition to a main component such as copper, silver and/or gold. This active metal, which is for example at least one element of the group Hf, Ti, Zr, Nb, Ce, establishes a connection between the solder and the ceramic by chemical reaction, while the connection between the solder and the metal is a metallic brazing connection. Using the active soldering process, it is advantageous to be able to bond diamond and/or silicon carbonate to the base body.

FIG. 1 shows a cooling device 1 according to a first exemplary embodiment of the present invention. In particular, cooling device 1 is one which is intended for cooling electrical components 4, such as laser diodes, in order to counteract overheating of laser diodes 4 during operation. Essential components of the cooling device 1 are a base body 2 with cooling channels 5, in particular micro cooling channels, running through it. The base body 2 is preferably made of a metal, for example copper. In addition, an inlet and an outlet are provided on the base body 2, via which a fluid, in particular a coolant, can be introduced and discharged during operation.

Furthermore, an outer face 20 comprises a connecting area 21 to which the laser diode 4 with the thickness D is connected, for example by means of a solder material 8. In the exemplary embodiment shown, the cooling channel 5 runs at least partially below the connecting area 21, as seen in a primary direction P, and the connecting area 21 preferably terminates with an edge of the base body 2 in a secondary direction S running perpendicular to the primary direction P. In particular, the primary direction P is perpendicular to the plane along which the connecting area 21 or the outer face 20 of cooling device 1 extends. Preferably, a deflection area U of the cooling channel 5, viewed in primary direction P, is arranged below the connecting area 21. This allows a cooling fluid in the cooling channel 5 to be brought as close as possible to the connecting area 21 and thus to the laser diode 4.

Due to the different thermal expansion coefficients in the base body 2 on the one hand and the electrical component 4 on the other hand, mechanical stress can occur which can sometimes lead to a deformation of the connecting area 21 or the laser diode 4. Since such changes in geometry directly cause the "smile" effect, it is advantageous to suppress this mechanical stress. For this purpose, preferably a first stabilising layer 11, if necessary, and a second stabilising layer 12 are provided, with which an adaptation of the expansion coefficient of the base body 2 to the expansion coefficient of the laser diode 4 is realized. In particular, it is intended that, viewed in primary direction P, the first stabilising layer 11, the second stabilising layer 12 and the connecting area 21 lie on top of each other.

In order to provide a cooling device 1 with which the laser diode 4 can be connected directly, i.e., without the connection of intermediate elements to the outer face 20, it is intended that the first stabilising layer 11 is offset with respect to the outer face 20 or the connecting area 21 by a distance A measured parallel to the primary direction P towards the interior of the base body 2. In other words: for the connection of laser diode 4, it is not necessary to connect the first stabilising layer 11 and the second stabilising layer 12 on the outer face 20 or as an intermediate layer between the base body 2 and the laser diode 4, so that the manufacturing effort is reduced. In addition, the offset arrangement with respect to the outer face 20 allows for the laser diode 4 to be electrically contacted directly via the base body 2.

Preferably, the first stabilising layer 11 and/or the second stabilising layer 12 should comprise or be made of diamond or silicon carbide (SiC). This has the advantage that the greatest possible heat spread can be achieved. In particular, in the embodiment shown in FIG. 1, the first stabilising layer 11 and the second stabilising layer 12 are made of the same material. In order to induce a preferably symmetrical change in the coefficient of expansion in the base body 2, the second stabilising layer 12 is offset by the further distance B towards the interior of the base body 2 with respect to a further outer face 20' opposite the outer face 20, the distance A preferably corresponding to the further distance B. In addition, a layer thickness D1 of the first stabilising layer 11 measured in the primary direction P corresponds to the layer thickness D2 of the second stabilising layer 12. In other words: the first stabilising layer 11 and the second stabilising layer 12 correspond to each other in form and preferably in the material composition, but are integrated into the base body 2 on opposite sides, the distance A of the first stabilising layer 11 to the outer face 20 corresponding to the further distance B of the second stabilising layer 12 to the further outer face 20'.

In order to keep material expenditure for the first stabilising layer 11 and the second stabilising layer 12 as low as possible, it is preferably provided that the first stabilising layer 11, the second stabilising layer 12 and the connecting surface 21 are arranged congruently to one another when viewed in the primary direction P, i.e., the first stabilising layer 11 and the second stabilising layer 12 extend in a plane perpendicular to the primary direction P or along the secondary direction S only as far as is predetermined by the connecting surface 21. In particular, it is intended that the first stabilising layer 11, the second stabilising layer 12 and the connecting surface 21 are flush with the base body 2 when viewed along a secondary direction S, i.e., the first stabilising layer 11, the second stabilising layer 12 and the connecting surface 21 are arranged at the edge of the base body.

Furthermore, it is intended that cooling channel 5 extends at least partially between the first stabilising layer 11 and the second stabilising layer 12. Preferably, a ratio of a length, measured along the secondary direction S, of that section T of the cooling channel 5 which, viewed in the primary direction P, is located between the first stabilising layer 11 and the second stabilising layer 12 to the length L1, measured along the secondary direction S, of the first stabilising layer 11 has a value between 0.2 and 0.8, preferably between 0.5 and 0.75 and particularly preferably between 0.6 and 0.7.

In addition, the base body 2 has a height C dimensioned along the primary direction P which is more than twice, preferably more than four times and particularly preferably more than six times as great as the thickness D of the laser diode 4 measured in the same direction. Furthermore, the base body 2 has a longitudinal extension E dimensioned along the secondary direction S which is more than three times, more than five times and particularly preferably more than eight times as great as the third length L3 of the laser diode 4 measured along the secondary direction S.

Figure 2:
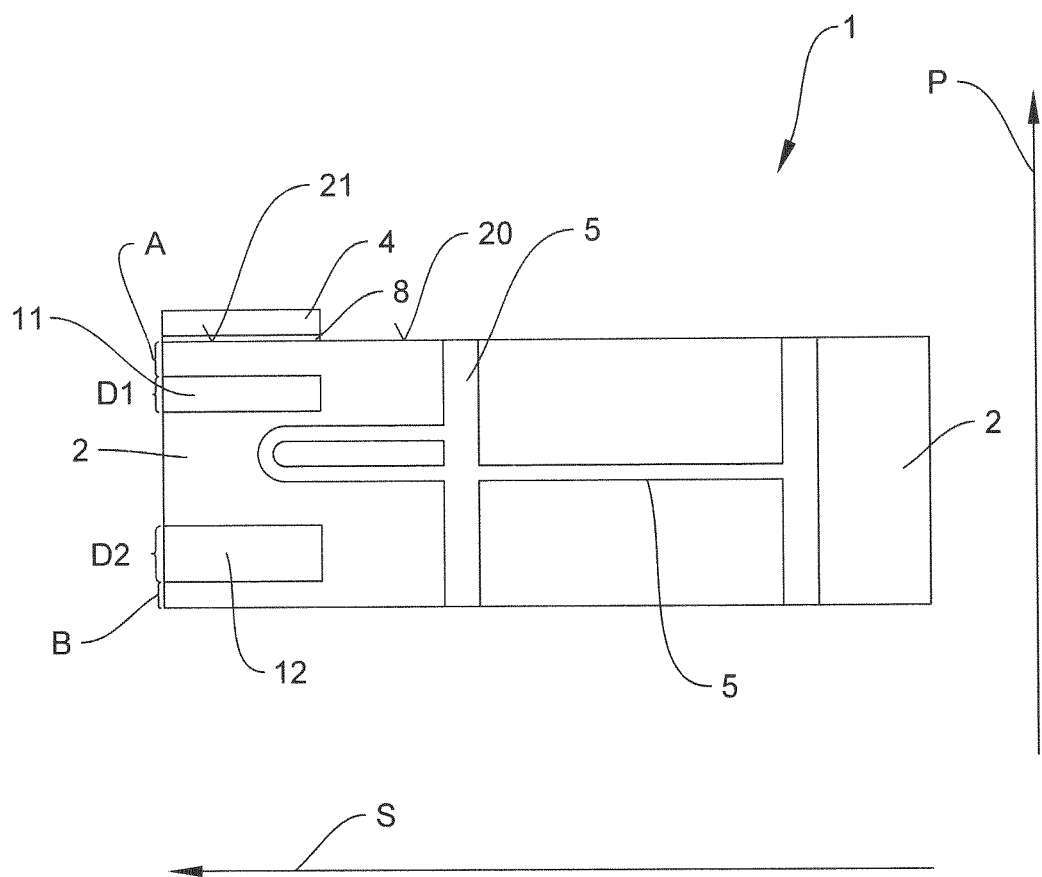
FIG. 2: illustrates a cooling device according to a second preferred embodiment of the present invention.

FIG. 2 shows a cooling device 1 according to a second preferred embodiment of the present invention. The only essential difference between the embodiment shown in FIG. 1 and the one in FIG. 2 is that the second stabilising layer 12 differs from the first stabilising layer 11. Preferably, the second stabilising layer 12 comprises a different material, such as molybdenum or tungsten, instead of diamond or silicon carbonate (SiC). In order to nevertheless ensure a symmetrical coefficient of expansion with respect to the primary direction P, the layer thickness D2 of the second stabilising layer 12 and preferably the further distance B to the further outer face 20' are adjusted accordingly.

Figure 3:
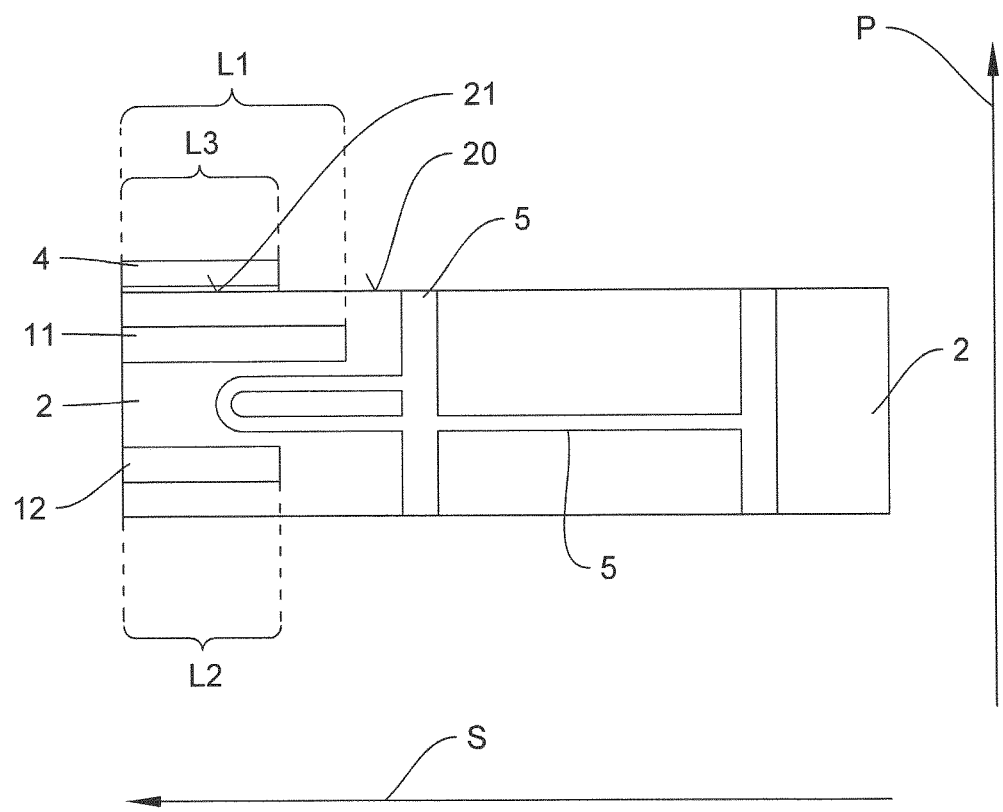
FIG. 3 illustrates a cooling device according to a third preferred embodiment of the present invention

FIG. 3 shows a cooling device 1 according to a second preferred embodiment of the present invention. The only essential difference between the embodiment shown in FIG. 1 and the one shown in FIG. 1 is that the first stabilising layer 11 extends further in the secondary direction S than a third length L3 of the laser diode 4 or the connecting surface 21. A ratio between a third length L3 of the connecting surface 21 measured along the secondary direction S and the first length L1 of the first stabilising layer 11 preferentially has a value between 0.33 and 0.99, preferably between 0.5 and 0.98 and particularly preferably between 0.66 and 0.95. Furthermore, the second stabilising layer 12 extends along the secondary direction S for a second length L2.

REFERENCE CHARACTER LIST 1 cooling device
2 base body
4 electrical component (e.g. laser diode)
5 cooling channel
8 lot material
11 first stabilising layer
12 second stabilising layer
20 outer face
20' further outer face
21 connecting surface
A distance
B further distance
C height of the base body
D layer thickness of the laser diode
D1 thickness of the first stabilising layer
D2 thickness of the second stabilising layer
L1 first length
L2 second length
L3 third length
E elongation of the base body
P primary direction
S secondary direction
T subsection
U deflection area

The invention claimed is:

1. A cooling device (1) for cooling an electrical component (4), the cooling device comprising:
   a base body (2) having an outer face (20) and at least one integrated cooling channel (5),
   a connecting surface (21) on the outer face (20) of the base body (2) for connecting the electrical component (4) to the base body (2) and
   a first stabilising layer (11),
wherein the first stabilising layer (11) and the connecting surface (21) are arranged at least partially one above the other along a primary direction (P), the first stabilising (11) layer being made from a non-metal and
   wherein the first stabilising layer (11) is offset relative to the connecting surface (21) of the outer face (20) by a distance (A) along a direction parallel to the primary direction (P) towards the interior of the base body (2), wherein the first stabilising layer (11) extends along a secondary direction perpendicular to the primary direction (P) over a first length and the connecting surface (21) extends along the secondary direction over a third length, wherein the ratio of the first length to the third length has a value between 1.0 and 3.0.

2. The cooling device (1) according to claim 1, wherein a second stabilising layer (12) is provided, wherein the first stabilising layer (11), the second stabilising layer (12) and the connecting surface (21) are arranged at least partially one above the other along a primary direction (P), and wherein the first stabilising layer (11) is arranged closer to the connecting surface (21) than the second stabilising layer (12).

3. The cooling device (1) according to claim 1, wherein a dis-tance (A) between the connecting surface (21) and the first stabilising layer (11) has a value between 100 µm and 1000 µm.

4. The cooling device (1) according to claim 1, wherein the first stabilising layer (11) comprises diamond.

5. The cooling device (1) according to claim 1, wherein the first stabilising layer comprises silicon carbide.

6. The cooling device (1) according to claim 1, wherein the first stabilizing layer (11) and the connecting surface (21) are congruent with each other in the primary direction (P).

7. The cooling device (1) according to claim 1, wherein the second stabilising layer (12) extends along the secondary direction (S) over a second length (L2), wherein the ratio of the second length (L2) to the third length (L3) has a value between 0.5 and 6.0.

8. The cooling device (1) according to claim 7, wherein the first length (L1) and/or the second length (L2) has a value between 5 and 25 mm.

9. The cooling device (1) according to claim 8, wherein the first length (L1) and/or the second length (L2) has a value between 6 and 18 mm.

10. The cooling device according to claim 7, wherein the first sta-bilising layer (11) and/or the second stabilising layer (12) does not extend over the entire longitudinal extension of the cooling device (1) along the secondary direction (S).

11. The cooling device (1) according to claim 7, wherein the first length (L1) and/or the third length (L3) is greater than the distance (A) between the first stabilising layer (11) and the connecting surface (21) measured in the primary direction (P).

12. The cooling device (1) according to claim 7, wherein the ratio of the second length (L2) to the third length (L3) has a value between 0.5 and 3.0.

13. The cooling device (1) according to claim 1, wherein between the first stabilising layer (11) and the second stabilising layer (12) a subsection (T) of the cooling channel (5) extends in the primary direction (P).

14. The cooling device (1) according to claim 1, wherein the first stabilising layer (11) differs from the second stabi-lising layer (12), with regard to its position within the base body (2), its material composition and/or its thickness (D1, D2) in a direction parallel to the primary direction (P).

15. A method for manufacturing a cooling device (1) according to claim 1, wherein the first stabilising layer (11) and/or the second stabilising layer (12) are bonded to the base body (2) by means of an active solder process.

16. The cooling device (1) according to claim 1, wherein the elec-trical component (4) is a laser diode.

17. The cooling device (1) according to claim 1, wherein the dis-tance (A) between the connection surface (21) and the first stabilizing layer (11) has a value between 150 µm and 750 µm.

18. The cooling device (1) according to claim 1, wherein a ratio between a third length (L3) of the connection surface (21) measured along the sec-ondary direction (S) and the first length (L1) of the first stabilizing layer (1) has a value between 0.5 and 0.98.

\* \* \* \* \*